United States Patent
Yu et al.

(10) Patent No.: US 11,935,878 B2
(45) Date of Patent: Mar. 19, 2024

(54) PACKAGE STRUCTURE AND METHOD FOR MANUFACTURING THE SAME

(71) Applicant: Vanguard International Semiconductor Corporation, Hsinchu (TW)

(72) Inventors: Hsiu-Mei Yu, Hsinchu (TW);
Guang-Yuan Jiang, Hsinchu (TW);
Cheng-Yi Hsieh, Jhubei (TW);
Wei-Chan Chang, Taoyuan (TW);
Chang-Sheng Lin, Jhunan Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 267 days.

(21) Appl. No.: 17/471,691

(22) Filed: Sep. 10, 2021

(65) Prior Publication Data
US 2023/0083337 A1 Mar. 16, 2023

(51) Int. Cl.
*H01L 23/02* (2006.01)
*H01L 23/00* (2006.01)
(Continued)

(52) U.S. Cl.
CPC ........ *H01L 25/115* (2013.01); *H01L 23/3128* (2013.01); *H01L 23/49816* (2013.01);
(Continued)

(58) Field of Classification Search
CPC . H01L 23/3114; H01L 23/3135; H01L 23/28; H01L 24/48; H01L 2224/48227
(Continued)

(56) References Cited

U.S. PATENT DOCUMENTS 5,386,342 A * 1/1995 Rostoker ............... H01L 23/564
257/668
5,844,317 A * 12/1998 Bertolet ................ H01L 23/528
257/781
(Continued)

FOREIGN PATENT DOCUMENTS

EP 3772094 A2 2/2021

OTHER PUBLICATIONS

Taiwanese Office Action and Search Report for Taiwanese Application No. 110118580, dated Mar. 30, 2022.

*Primary Examiner* — Nitin Parekh
(74) *Attorney, Agent, or Firm* — Birch, Stewart, Kolasch & Birch, LLP

(57) ABSTRACT

A method for manufacturing a package structure includes providing a carrier board; providing at least one die having a top surface, a bottom surface, and a side surface on the carrier board; and forming a protective layer to cover at least a portion of the side surface of the die. The die includes a substrate, a semiconductor layer, a gate structure, a source structure and a drain structure, at least one dielectric layer, and at least one pad. The semiconductor layer is disposed on the substrate. The gate structure is disposed on the semiconductor layer. The source and the drain structures are disposed on opposite sides of the gate structure. The dielectric layer covers the gate, source, and drain structures. The pad is disposed on the dielectric layer and penetrates through the dielectric layer to electrically contact with the gate, source or drain structure.

20 Claims, 5 Drawing Sheets

(51) Int. Cl.
*H01L 23/31* (2006.01)
*H01L 23/498* (2006.01)
*H01L 25/00* (2006.01)
*H01L 25/065* (2023.01)
*H01L 25/11* (2006.01)

(52) U.S. Cl.
CPC .............. *H01L 24/05* (2013.01); *H01L 24/13* (2013.01); *H01L 24/48* (2013.01); *H01L 24/97* (2013.01); *H01L 25/0655* (2013.01); *H01L 25/50* (2013.01); *H01L 2224/48227* (2013.01); *H01L 2924/15311* (2013.01); *H01L 2924/181* (2013.01)

(58) Field of Classification Search
USPC .......................... 257/784, 787, 790
See application file for complete search history.

(56) References Cited

U.S. PATENT DOCUMENTS

| | | | | |
|---|---|---|---|---|
| 5,902,686 | A * | 5/1999 | Mis | H01L 24/11 228/232 |
| 6,181,569 | B1 * | 1/2001 | Chakravorty | H01L 23/3114 361/764 |
| 7,417,309 | B2 * | 8/2008 | Takahashi | H01L 24/29 257/676 |
| 9,368,460 | B2 * | 6/2016 | Yu | H01L 23/5389 |
| 2012/0292642 | A1 | 11/2012 | Urata et al. | |
| 2014/0091482 | A1 * | 4/2014 | Lin | H01L 23/28 257/782 |
| 2015/0060872 | A1 * | 3/2015 | Hosseini | H01L 23/4951 257/77 |
| 2016/0093545 | A1 | 3/2016 | Lee et al. | |
| 2019/0043733 | A1 * | 2/2019 | Kapusta | H01L 21/4857 |
| 2020/0365718 | A1 | 11/2020 | Lee et al. | |

* cited by examiner

PACKAGE STRUCTURE AND METHOD FOR MANUFACTURING THE SAME

BACKGROUND OF THE DISCLOSURE

Field of the Disclosure

The present disclosure relates to a package structure and a method for manufacturing the same, and, in particular, to a package structure with a protective layer covering a side surface of the die and a method for manufacturing the same.

Description of the Related Art

In order to protect chips from environmental moisture, pollution, and damage caused by manual operation, the packaging process has become imperative. However, after packaging, the reliability of the package structure is often poor and the process window of the packaging process is decreasing, which leads to an increase in the cost of the packaging process.

In detail, a die cut from a wafer needs to be electrically connected to a package substrate. Thus, various packaging processes types such as wire bond assembly, also known as chip on board, or flip chip type assembly, are provided. The wire bond assembly includes a die bond, wire bond, molding steps. However, when a die is packaged using the packaging process in various types, an unnecessary conductive path may be produced during the bonding process for bonding the die to the package substrate. Thus, a short circuit may occur, which is a problem. On the other hand, there may also be a problem in that the die can be easily peeled off of the package substrate due to insufficient bonding, which may cause the device to fail.

Therefore, although the existing package structures and methods for manufacturing the same have gradually met their intended purposes, they have not been entirely satisfactory in all respects. Therefore, there are still some problems to be overcome with regard to a package structure with higher reliability and a manufacturing method having a wider process window.

BRIEF SUMMARY OF THE DISCLOSURE

In view of the above problems, the present disclosure provides a protective layer covering the side surface of the die to protect the exposed side surface of the die. That is, the sidewall of the die is protected. Therefore, short circuits which may be caused by an unnecessary conductive path being formed between the exposed side surface of the die and the package substrate can be avoided during the packaging process. In addition, since the protective layer extends to the side surface of the die, and may even extend to the bottom surface of the die, the tolerance of the dispensing range of the bonding layer used in the bonding process may be larger. In other words, the present disclosure may improve the reliability of the package structure and the process window and the yield of the method of manufacturing the package structure.

In accordance with some embodiments of the present disclosure, a method for manufacturing a package structure is provided. The method for manufacturing a package structure includes the following steps. A carrier board is provided. At least one die is provided on the carrier board. A protective layer is formed to cover at least a portion of the side surface of the at least one die. The at least one die has a top surface, a bottom surface, and a side surface. The at least one die includes a substrate, a semiconductor layer, a gate structure, a source structure, a drain structure, at least one dielectric layer, and at least one pad. The semiconductor layer is disposed on the substrate. The gate structure is disposed on the semiconductor layer. The source structure and the drain structure are disposed on opposite sides of the gate structure. The at least one dielectric layer covers the gate structure, the source structure, and the drain structure. The at least one pad is disposed on the at least one dielectric layer and penetrates through the at least one dielectric layer to electrically contact with the gate structure, the source structure, or the drain structure.

In accordance with some embodiments of the present disclosure, a package structure is provided. The package structure includes at least one die and a protective layer. The at least one die has a top surface, a bottom surface, and a side surface. The at least one die includes a substrate, a semiconductor layer, a gate structure, a source structure, a drain structure, at least one dielectric layer, and at least one pad. The semiconductor layer is disposed on the substrate. The gate structure is disposed on the semiconductor layer. The source structure and the drain structure are disposed on opposite sides of the gate structure. The at least one dielectric layer covers the gate structure, the source structure, and the drain structure. The at least one pad is disposed on the at least one dielectric layer and penetrates through the at least one dielectric layer to electrically contact with the gate structure, the source structure or the drain structure. The protective layer covers at least a portion of the side surface of the at least one die.

The package structure and the method for manufacturing the same of the present disclosure may be applied in various types of package devices. In order to make the features and advantages of some embodiments of the present disclosure more easily understood, some embodiments of the present disclosure are listed below in conjunction with the accompanying drawings, and are described in detail as follows.

BRIEF DESCRIPTION OF THE DRAWINGS

Through the following detailed description and the accompanying drawings, a person of ordinary skill in the art will better understand the viewpoints of some embodiments of the present disclosure. It should be noted that, in accordance with standard practice in the industry, various features are not drawn to scale and are used for illustration purposes. In fact, the dimensions of the various features may be arbitrarily increased or reduced for clarity of discussion.

DETAILED DESCRIPTION OF THE DISCLOSURE

Figure 1:
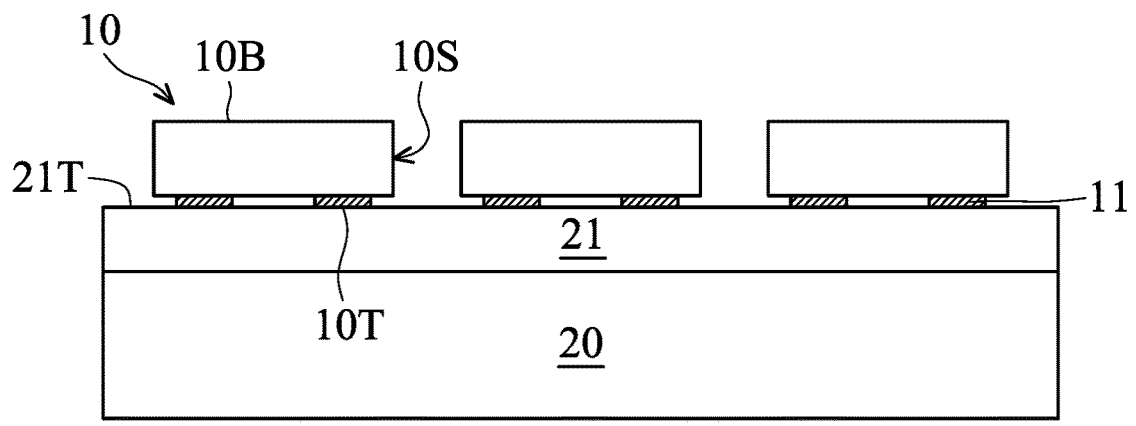
FIGS. 1-5 are schematic cross-sectional views of a package structure at various stages of formation, according to some embodiments of the present disclosure.

The following disclosure provides many different embodiments or examples for implementing different features of the package structure and the method for manufacturing the package structure disclosed herein. Specific examples of each feature and its configuration are described below to simplify the embodiments of the present disclosure. Naturally, these are only examples and are not intended to limit the present disclosure. For example, if the description mentions that the first feature is formed on the second feature, it may include an embodiment in which the first feature and second feature are in direct contact, or may include an embodiment in which additional feature is formed between the first feature and the second feature thereby the first feature and the second feature do not directly contact. In addition, some embodiments of the present disclosure may repeat reference numerals and/or letters in different examples. Such repetition is for conciseness and clarity, and is not used to indicate the relationship between the different embodiments and/or aspects discussed herein.

Some modifications of the embodiments are described below. In the different accompanying drawings and illustrated embodiments, reference numerals that are similar or the same are used to identify features that are similar or the same. It should be understood that additional operations may be provided before, during, and after the method disclosed herein, and some of the described operations in some embodiments may be deleted or replaced with other embodiments of the method. In addition, although the features in some embodiments are described in a specific order, these descriptions may also be performed in other logical orders. Other features may be added to the package structure in the embodiment of the present disclosure. In different embodiments, some features may be replaced or omitted.

Furthermore, spatially relative terms, for example, "under", "below", "lower", "on", "over", "above", "upper", "bottom surface", "top surface" or the like are used for ease of the present disclosure of one feature(s) relationship to another feature(s). The spatially relative terms are intended to encompass different orientations of the feature in use or operation, in addition to the orientation depicted in the accompany drawings. The features may be otherwise oriented (e.g., rotated 90 degrees or other orientations) and the spatially relative terms used herein should be interpreted accordingly.

Hereinafter, the terms "approximately", "about", and "substantially" usually mean within ±20% of a given value or a given range, for example, within ±10%, within 5%, within 3%, within 2%, within 1%, or within 0.5%. It should be noted that, the value provided in the specification is an approximate value, that is, without specific description of "approximately", "about", and "substantially", the meanings of the terms may still be implied.

Unless otherwise defined, all terms (including technical and scientific terms) used herein have the same meaning as commonly understood by a person of ordinary skill in the art. It should be understood that terms such as those defined in commonly used dictionaries should be interpreted as having a meaning consistent with the relevant technology and the background or context of this disclosure, and should not be interpreted in an idealized or excessively formal way, unless there is a special definition in the embodiments of the present disclosure. Herein, the term "wafer" refers to circular silicon slices used to make semiconductor devices, which usually include a plurality of dies. Herein, the term "die" refers to individual chips cut/diced from the wafer before performing a packaging process.

FIGS. 1-5 are schematic cross-sectional views of a package structure at various stages of formation, according to some embodiments of the present disclosure.

Referring to FIG. 1, at least one die 10 and a carrier board 20 are provided. The die 10 has a top surface 10T, a side surface 10S, and a bottom surface 10B, and the die 10 is disposed on the carrier board 20. In some embodiments, the top surface 10T of the die 10 is bonded to the carrier board 20. In other words, the contact in the die 10 is bonded to the carrier board 20. In some embodiments, the contact in the die 10 may be a pad 11. That is, the pad 11 of the die 10 is bonded to the carrier board 20.

In some embodiments, an adhesive layer 21 may be formed on the carrier board 20. The adhesive layer 21 has a top surface 21T away from the carrier board 20. Then, by turning over or flip the die 10, the top surface 10T of the die 10 is bonded to the top surface 21T of the adhesive layer 21. In some embodiments, the carrier board 20 may be a temporary carrier board. In some embodiments, the adhesive layer 21 may be a cleavable type adhesive layer, so the adhesive layer 21 may be removed by applying external force. In some embodiments, the adhesive layer 21 may be formed only on the die 10 and/or the carrier board 20 where is desired to be bonded.

Specifically, the top surface of the pad 11 on the upper layer of the source structure (for example, the source metal layer 172 shown in FIG. 8) of the die 10 is bonded to the top surface 21T of the adhesive layer 21. Also, the top surface of the pad 11 on the upper layer of the drain structure (for example, the drain metal layer 182 shown in FIG. 8) of the die 10 is bonded to the top surface 21T of the adhesive layer 21.

Figure 2:
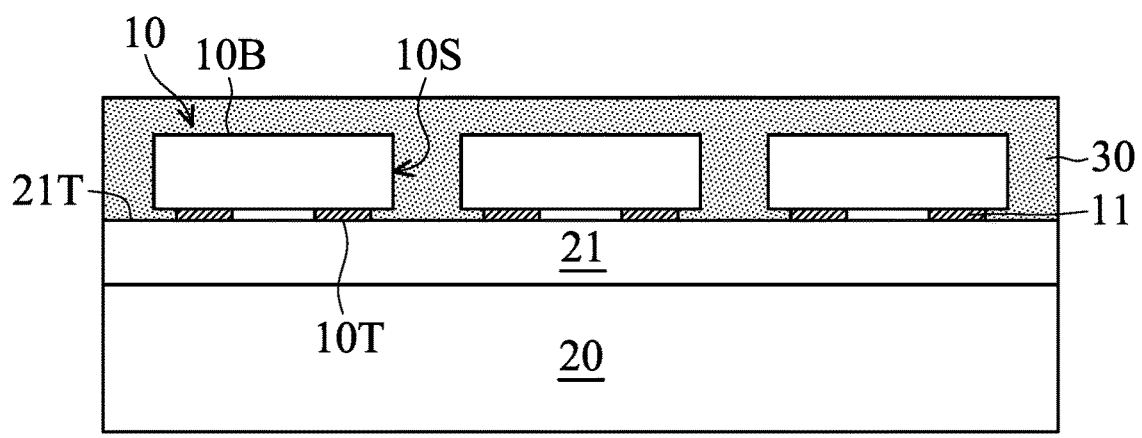

Referring to FIG. 2, a protective layer 30 is formed on the side surface 10S of the die 10 and on the top surface 21T of the adhesive layer 21. The protective layer 30 may cover the side surface 10S of the die 10 and the top surface 21T of the adhesive layer 21. In some embodiments, the protective layer 30 may completely cover the side surfaces 10S of the die 10. For example, the protective layer 30 completely covers at least four side surfaces 10S of the die 10 or completely covers all of the side surfaces 10S of the die 10. In other embodiments, the protective layer 30 may partially cover the side surface 10S of the die 10. For example, the protective layer 30 may cover the side surface of the seed layer in the die 10. In some embodiments, when the die 10 has a plurality of side surfaces 10S, the protective layer 30 may be formed on each of the side surfaces 10S of the die 10. For example, when the die 10 has a top surface 10T, four side surfaces 10S, and a bottom surface 10B, the protective layer 30 may be formed on each of the four side surfaces 10S of the die 10. In some embodiments, the protective layer 30 may cover a portion of the top surface 10T of the die 10. In some embodiments, the protective layer 30 is formed on the bottom surface 10B of the die 10 in addition to the side surface 10S of the die 10. The bottom surface 10B of the die 10 is the surface of the die 10 away from the pad 11. The protective layer 30 may cover the bottom surface 10B of the die 10. In some embodiments, the protective layer 30 may continuously extend along the side surface 10S of the die 10 to the bottom surface 10B of the die 10.

As shown in FIG. 2, in some embodiments, a plurality of dies 10 may be provided at the same time according to requirements, and the top surfaces of the dies 10 are bonded to the carrier board 20. There are gaps between the dies 10. Therefore, a protective layer 30 may be formed between the side surfaces of the dies 10. That is, the protective layer 30 may cover the gap between adjacent dies 10. In some embodiments, the protective layer 30 may be formed between the pad 11 on the upper layer of the source structure (for example, the source metal layer 172 shown in FIG. 8) of one die 10 and the pad 11 on the upper layer of the drain structure (for example, the drain metal layer 182 shown in FIG. 8) of another die 10 which is closest to the one die 10. In some embodiments, the material of the protective layer 30 may completely fill the gaps between the side surfaces 10S of the dies 10, or the material of the protective layer 30 may partially fill the gaps between the side surfaces 10S of the dies 10.

In some embodiments, the protective layer 30 is a molding material or a dielectric material. For example, the protective layer 30 may be or include epoxy resin, organic polymer, polymer with or without silica-based filler or glass filler, or other materials. In some embodiments, the protective layer 30 is an insulating material. In some embodiments, the protective layer 30 may be black glue.

In some embodiments, the material of the protective layer 30 is applied on the adhesive layer 21 and covers the side surface 10S and/or the bottom surface 10B of the die 10. Then, the material of the protective layer 30 is heated to a predetermined temperature and maintained for a predetermined period of time by using a curing process such as an annealing process or other heating processes, so as to cure the material of the protective layer 30 and form the protective layer 30 on the adhesive layer 21. In some embodiments, after the formation of the protective layer 30, an excess portion of the protective layer 30 is removed from the bottom surface 10B of the die 10 by using a planarization process such as a chemical mechanical planarization (CMP) process or a thinning process.

As shown in FIG. 2, in some embodiments, the planarization process may be omitted. Alternatively, a planarization process may be performed, but the top surface of the protective layer 30 is a flat surface without exposing the bottom surface 10B of the die 10. In other words, the protective layer 30 may cover the bottom surface 10B of the die 10. For example, the substrate of the die 10 (for example, the substrate 110 shown in the FIG. 8) is located between the protective layer 30 and the semiconductor layer (for example, the semiconductor layer 120 shown in the FIG. 8) of the die 10. In this case, since the protective layer 30 remains on the bottom surface 10B of the die 10, the subsequent marking process is easily performed.

In other embodiments, a planarization process may be performed, so that the top surface of the protective layer 30 is substantially level with the bottom surface 10B of the die 10. For example, the top surface of the protective layer 30 formed between the side surfaces 10S of the dies 10 may be a flat surface. Also, the top surface of the protective layer 30 is level with the top surfaces of the dies 10.

Figure 3:
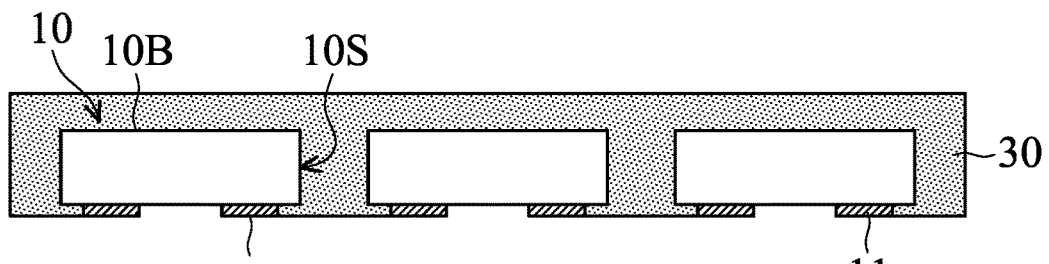

Referring to FIG. 3, in some embodiments, the adhesive layer 21 and the carrier board 20 may be removed by a heating process or illuminating process, but the present disclosure is not limited thereto, and a person of ordinary skill in the art may use other suitable processes to remove the adhesive layer 21 and/or the carrier board 20.

Figure 4:
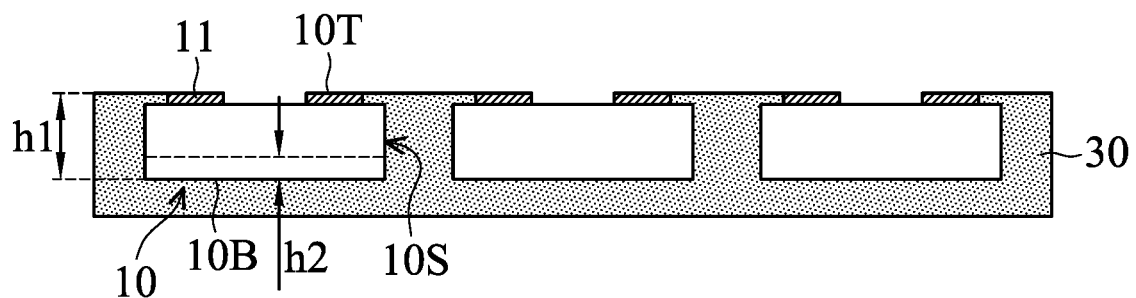

Referring to FIG. 4, the die 10 with the protective layer 30 provided on the side surface 10S is turned upside down. It should be noted that, the die 10 has a first height h1 from the bottom surface 10B to the top surface 10T, and the die 10 has a second height h2 from the bottom surface 10B to a bottom surface of a seed layer (for example, the seed layer 113 shown in the FIG. 8) included in the die 10. As shown in FIG. 4, in these embodiments, the thickness of the protective layer 30 may be greater than the first height h1 to avoid the problem of short circuit.

In addition, as shown in FIG. 4, the dies 10 may be encapsulated in the protective layer 30, so a subsequent process may be performed on the dies 10 at the same time according to requirements, thereby improving efficiency and yield.

Figure 5:
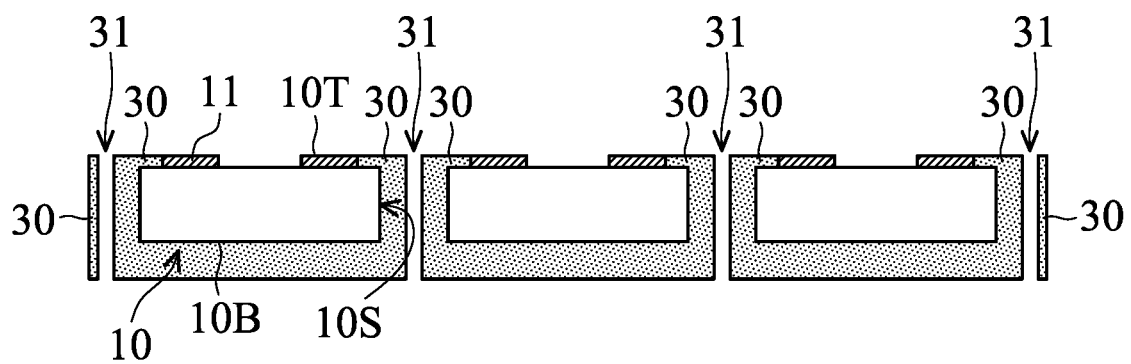

Referring to FIG. 5, a cutting process 31 may be further performed to separate the dies 10 from each other. In some embodiments, the cutting path in the cutting process 31 is located in the gap between adjacent dies 10 to separate the dies 10 from each other by cutting the protective layer 30. After the cutting process 31, the protective layer 30 is still provided on the side surface 10S of each die 10. Thus, each die 10 is protected by the protective layer 30. In some embodiments, the cutting process 31 separates each die 10 into a unit. In other embodiments, the cutting process 31 separates a plurality of dies 10 such as 2, 3, 4, 5 or more dies, into a unit according to requirements. In some embodiments, the cutting process 31 may be a laser cutting process.

Figure 6:
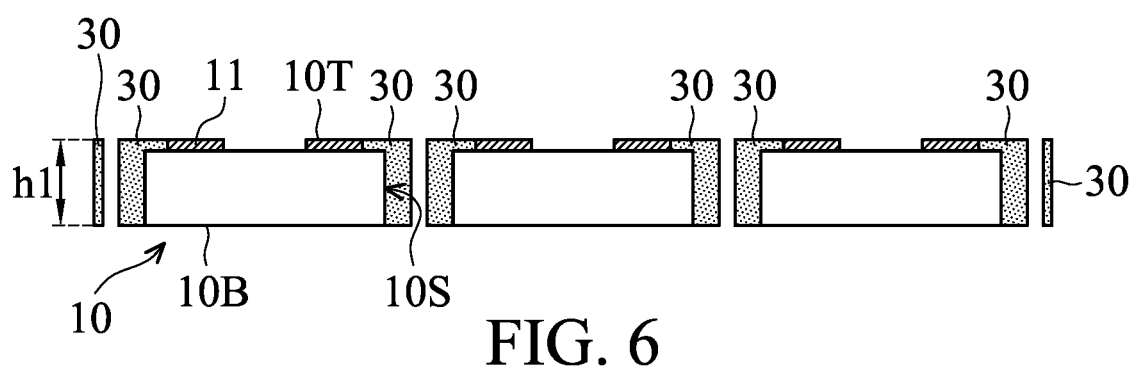
FIGS. 6 and 7 are schematic cross-sectional views of a package structure, according to other embodiments of the present disclosure.
Figure 7:
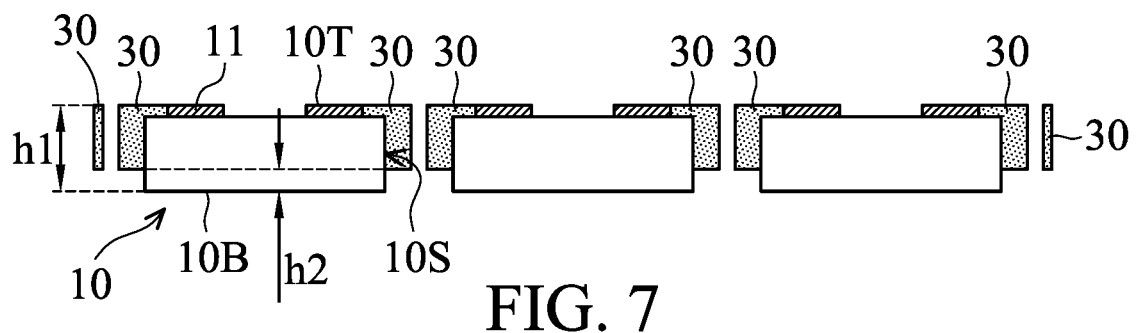

Similar to FIG. 5, FIGS. 6 and 7 are schematic cross-sectional views of the package structure, according to other embodiments. For ease of description, the same or similar manufacturing processes are omitted.

Referring to FIG. 6, it shows an embodiment in which the top surface of the protective layer 30 is substantially level with the bottom surface 10B of the die 10. In some embodiments, a planarization process may be further performed, so that the top surface of the protective layer 30 is substantially level with the bottom surface 10B of the die 10. In these embodiments, the thickness of the protective layer 30 may be substantially the same as the first height h1 of the die 10. In these embodiments, since the bottom surface 10B of the die 10 is exposed, the die 10 may have good heat dissipation performance. Furthermore, the overall thickness of the package structure formed by the subsequent processes may be reduced.

In other embodiments, the carrier board 20 on which the adhesive layer 21 is formed is provided, and the bottom surface 10B of the die 10 is then bonded to the adhesive layer 21. Next, the protective layer 30 is formed on the side surface 10S of the die 10 to prevent the protective layer 30 from covering the bottom surface 10B of the die 10. Thus, the top surface of the protective layer 30 is substantially level with the bottom surface 10B of the die 10. Then, the aforementioned removal of the adhesive layer 21 and the carrier board 20, the cutting process 31 and other further processes are performed.

Referring to FIG. 7, it is another embodiment. Compared with the aforementioned embodiment, the difference is that the protective layer 30 only covers the side surface 10S of the die 10. For example, the protective layer 30 extends from the top surface 10T of the die 10 to the side surface of the seed layer of the die 10, and exposes the buried layer and the base (for example, the buried layer 112 and base 111 shown in FIG. 8) of the die 10. In this embodiment, the process cost of formation of the protective layer 30 on the side surface 10S of the die 10 may be reduced. In this embodiment, the thickness of the protective layer 30 may be less than or same as the first height h1 of the die 10. In this embodiment, the thickness of the protective layer 30 may be substantially the same as the difference between the first height h1 and the second height h2 of the die 10.

Figure 8:
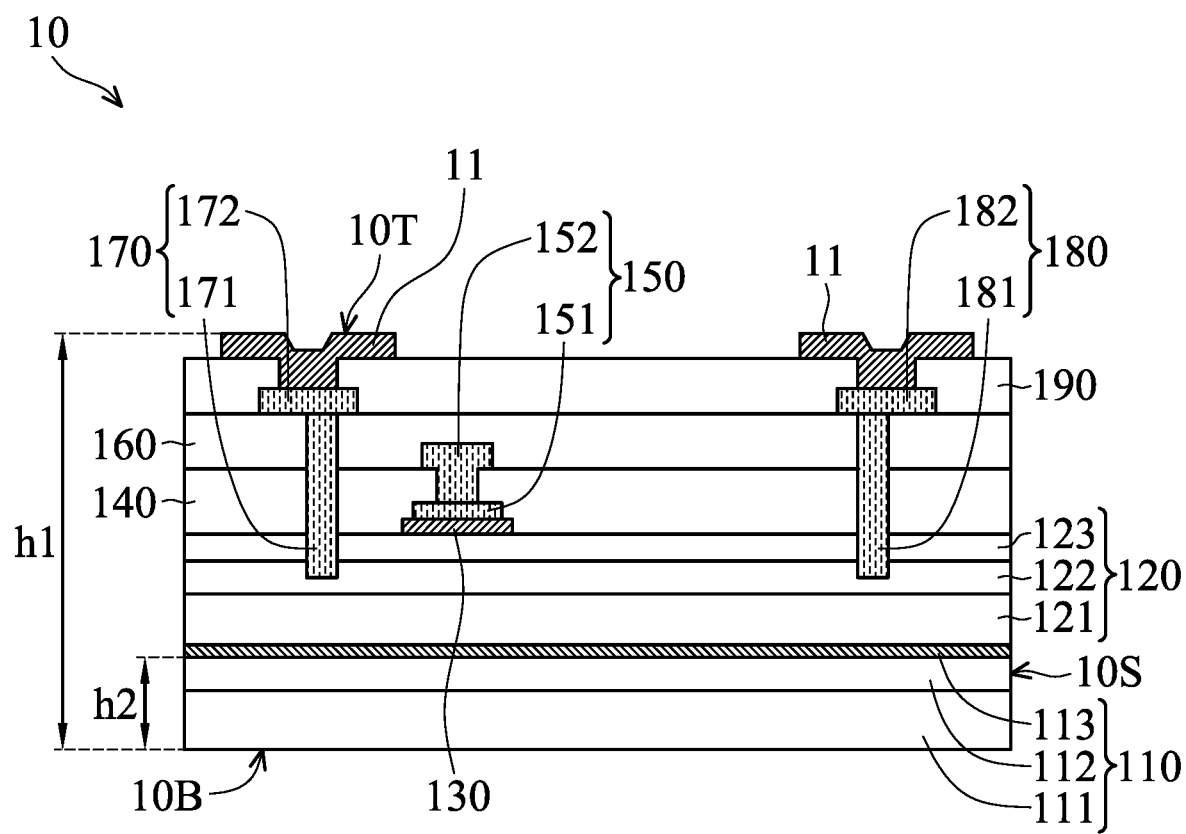
FIG. 8 is a schematic cross-sectional view of exemplary structure of a die, according to some embodiments of the present disclosure.

FIG. 8 is a schematic cross-sectional view of exemplary structure of a die, according to some embodiments of the present disclosure. It should be understood that, according to different embodiments, additional layers and/or features may be added to the die 10. In some embodiments, each layer and/or feature in the die 10 described below may be replaced or deleted.

Referring to FIG. 8, the die 10 includes a substrate 110, a semiconductor layer 120, a gate structure 150, a source structure 170 and a drain structure 180, an inter-metal dielectric layer 190, and a pad 11. The semiconductor layer 120 is disposed on the substrate 110. The gate structure 150 is disposed on the semiconductor layer 120. The source structure 170 and the drain structure 180 are disposed adjacent to the gate structure 150 and are respectively disposed on opposite sides of the gate structure 150. The inter-metal dielectric layer 190 covers the gate structure 150, the source structure 170 and the drain structure 180. The pad 11 is disposed on the inter-metal dielectric layer 190. The pad 11 penetrates the inter-metal dielectric layer 190 to electrically connect the gate structure 150, the source structure 170 or the drain structure 180.

As shown in FIG. 8, in some embodiments, the substrate 110 of the die 10 may further include a substrate 111, a buried layer 112, and a seed layer 113. The buried layer 112 is disposed on the substrate 111, and the seed layer 113 is disposed between the buried layer 112 and the semiconductor layer 120. The buried layer 112 may include silicon oxide, oxide, nitride, oxynitride, aluminum nitride or silicon carbide, other suitable materials, or a combination thereof.

In some embodiments, the substrate 110 is a semiconductor-on-insulator (SOI) substrate. In some embodiments, the base 111 may include a ceramic base or a silicon (Si) base. In some embodiments, the base 111 is an insulating base. In some embodiments, the material of the aforementioned ceramic base may include aluminum nitride (AlN), silicon carbide (SiC), aluminum oxide ($Al_2O_3$), sapphire, other suitable materials, or a combination thereof. In some embodiments, the ceramic powder may be sintered at a high temperature by powder metallurgy to form the aforementioned ceramic base. In some embodiments, the base 111 is a ceramic base, and the buried layer 112 encapsulates the ceramic base. The buried layer 112 may completely encapsulate the ceramic base, or may partially encapsulate the ceramic base.

In some embodiments, when the buried layer 112 completely encapsulates the ceramic base, a portion of the buried layer 112 may be removed before bonding the top surface 10T of the die 10 to the carrier board 20 to expose the ceramic base. In other embodiments, when the buried layer 112 completely encapsulates the ceramic base, a portion of the buried layer 112 may be removed when the planarization process shown in FIG. 2 is performed, so as to expose the ceramic base. Therefore, the aforementioned protective layer 30 shown in FIG. 2 may be in contact with the ceramic base.

In some embodiments, the buried layer 112 may be a layer having good thermal stability at high temperatures. In some embodiments, the buried layer 112 may include silicon oxide. For example, the buried layer 112 may be a silicon oxide layer formed of tetraethoxysilane (TEOS). In some embodiments, the buried layer 112 may be a dielectric layer formed by a plasma-enhanced chemical vapor deposition (PECVD) process. In some embodiments, the buried layer 112 provides a higher-quality surface to facilitate subsequent formation of other layers on the surface of the buried layer 112.

In some embodiments, the seed layer 113 may include silicon, silicon carbide, aluminum nitride, aluminum gallium nitride, other III-V compound semiconductor materials, other suitable materials, or a combination thereof. In some embodiments, the seed layer 113 may be formed by an epitaxial growth process. For example, a metal organic chemical vapor deposition (MOCVD) process, a hydride vapor phase epitaxy (HVPE) process, a molecular beam epitaxy (MBE) process, other suitable processes, or a combination thereof may be used to conformally form the seed layer 113 on the buried layer 112. The seed layer 113 may reduce and/or prevent the crystal lattice difference between the base 111 and other layers disposed on the base 111, so as to improve the quality of the crystallization. In some embodiments, the seed layer 113 is silicon.

As shown in FIG. 8, in some embodiments, the semiconductor layer 120 may further include a buffer layer 121, a channel layer 122, and a barrier layer 123. The buffer layer 121 is disposed on the seed layer 113. The channel layer 122 is disposed on the buffer layer 121. The barrier layer 123 is disposed on the channel layer 122. In some embodiments, the semiconductor layer 120 is a GaN-based semiconductor layer.

In some embodiments, the buffer layer 121 may include a group III-V compound semiconductor material, such as a group III nitride. The material of the buffer layer 121 may be or include gallium nitride, aluminum nitride, aluminum gallium nitride (AlGaN), aluminum indium nitride (AlInN), a single layer or multiple layers thereof, or any other suitable materials. In some embodiments, the buffer layer 121 may be formed by a deposition process. In some embodiments, the mismatch between the channel layer 122 and the substrate 110 may cause strain. The buffer layer 121 may reduce and/or prevent the strain of the channel layer 122 on the buffer layer 121 to prevent defects from being formed in the channel layer 122. In some embodiments, the buffer layer 121 may be omitted.

In some embodiments, the channel layer 122 may include one or more group III-V compound semiconductor materials, such as group III nitrides. The material of the channel layer 122 may be or include gallium nitride, aluminum gallium nitride, aluminum indium nitride, indium gallium nitride (InGaN), indium aluminum gallium nitride (InAlGaN), other suitable materials, or a combination thereof, but the present disclosure is not limited thereto. The channel layer 122 may be formed by a deposition process.

In some embodiments, the barrier layer 123 may include a group III-V compound semiconductor material, such as a group III nitride. The barrier layer 123 may be or include aluminum nitride, aluminum gallium nitride, aluminum indium nitride, indium aluminum gallium nitride, other suitable materials, or a combination thereof. The barrier layer 123 may be formed by a deposition process.

Following the above, since the channel layer 122 and the barrier layer 123 have different lattice constants, the piezoelectric polarization effect and the spontaneous polarization effects may be induced. Therefore, the two-dimensional electron gas (2DEG) may be formed on the hetero interface between the channel layer 122 and the barrier layer 123. The aforementioned two-dimensional electron gas serves as a current path. In some embodiments, there are no dopants in the channel layer 122 and the barrier layer 123. In other embodiments, the channel layer 122 and the barrier layer 123 may have dopants, for example, n-type dopants or p-type dopants.

As shown in FIG. 8, a compound semiconductor layer 130 is disposed on the semiconductor layer 120. In some embodiments, the compound semiconductor layer 130 may be p-type doped or n-type doped gallium nitride. The compound semiconductor layer 130 may inhibit the two-dimensional electron gas below the compound semiconductor layer 130, so that the semiconductor structure subsequently formed in the die 10 may have a normally-off state. The compound semiconductor layer 130 may be disposed corresponding to the gate structure 150.

As shown in FIG. 8, a gate structure 150 may be formed on the barrier layer 123. A source structure 170 and a drain structure 180 may be formed on opposite sides of the gate structure 150. Inner dielectric layer such as a first dielectric layer 140 and the second dielectric layer 160 are formed on the barrier layer 123. The gate structure 150 may include a gate electrode 151 and a gate metal layer 152. The source structure 170 may include a source electrode 171 and a source metal layer 172. The drain structure 180 may include a drain electrode 181 and a drain metal layer 182.

In some embodiments, the gate electrode 151 is disposed on the compound semiconductor layer 130. The material of the gate electrode 151 may be a conductive material. For example, the conductive material may include a metal, a metal nitride, a semiconductor material or a combination thereof, or any other suitable conductive material, but the present disclosure is not limited thereto. In some embodiments, the conductive material may be gold (Au), nickel (Ni), platinum (Pt), palladium (Pd), iridium (Ir), titanium (Ti), chromium (Cr), tungsten (W), Aluminum (Al), copper (Cu), titanium nitride (TiN), tantalum nitride (TaN), nickel silicide (NiSi), cobalt silicide (CoSi), tantalum carbide (tantalum carbide, TaC), tantalum silicide nitride (TaSiN), tantalum carbide nitride (TaCN), titanium aluminide (TiAl), titanium aluminide nitride, TiAlN), the like, or a combination thereof. The aforementioned semiconductor material may be polycrystalline silicon or polycrystalline germanium. The aforementioned conductive material may be formed by, for example, chemical vapor deposition (CVD), sputtering, resistance heating evaporation, electron beam evaporation, or other suitable deposition methods.

In some embodiments, the first dielectric layer 140 and/or the second dielectric layer 160 are formed to cover the gate electrode 151. The first dielectric layer 140 may be formed by a deposition process. In some embodiments, the first dielectric layer 140 may be or include one or more single-layer or multi-layer dielectric materials, for example, silicon oxide, silicon nitride, silicon oxynitride, tetraethoxysilane, phosphosilicate glass (PSG), borophosphosilicate glass (BPSG), low dielectric constant dielectric materials, other suitable dielectric materials, or a combination thereof. The low dielectric constant dielectric materials may include fluorinated silica glass (FSG), hydrogen silsesquioxane (HSQ), carbon-doped silicon oxide, amorphous carbon fluoride, parylene, bis-benzocyclobutenes (BCB) or polyimide. For example, in some embodiments, a spin coating process, a chemical vapor deposition process, a physical vapor deposition (PVD) process, an atomic layer deposition (ALD) process, a high-density plasma chemical vapor deposition (HDPCVD) process, other suitable processes, or a combination thereof may be used to form the first dielectric layer 140. The second dielectric layer 160 may include the same or different material as the first dielectric layer 140, and the second dielectric layer 160 may be formed by the same or different process as the process for forming the first dielectric layer 140. The gate electrode 151 may be buried in the first dielectric layer 140, the gate metal layer 152 may be disposed on the first dielectric layer 140, and the second dielectric layer 160 may cover the gate metal layer 152.

As shown in FIG. 8, the source electrode 171, the source metal layer 172, the drain electrode 181, and the drain metal layer 182 may be formed by patterning process and deposition process. The source electrode 171, the source metal layer 172, the drain electrode 181, and the drain metal layer 182 may include the same or different materials as the gate electrode 151 and/or the gate metal layer 152. In some embodiments, the source electrode 171 may pass through the second dielectric layer 160, the first dielectric layer 140, and the barrier layer 123, so as to electrically connect with the channel layer 122 and the source metal layer 172. In some embodiments, the drain electrode 181 may pass through the second dielectric layer 160, the first dielectric layer 140, and the barrier layer 123, so as to electrically connect with the channel layer 122 and the drain metal layer 182. In some embodiments, the source metal layer 172 and/or the drain metal layer 182 may serve as a contact for the die 10. An inter-metal dielectric layer (IMD layer) 190 is further formed on the source metal layer 172 and the drain metal layer 182. The pad 11 penetrates through the inter-metal dielectric layer 190 to electrically connect to the source metal layer 172 and the drain metal layer 182, respectively. In some embodiments, the inter-metal dielectric layer 190 may be a single layer or multiple layers. In these embodiments, the top surface of the pad 11 is substantially the top surface 10T of the die 10.

It should be particularly noted that, after the aforementioned layers and/or features have been formed on the substrate 111, that is, after a semiconductor structure such as a high electron mobility transistor (HEMT) has been formed on the wafer by processing the wafer, a plurality of dies 10 are cut from the wafer. In some embodiments, the die 10 is the high electron mobility crystal transistor. In some embodiments, the die 10 may include a plurality of semiconductor structures. For example, the die 10 may include 2, 3, 4, 5 or more high electron mobility transistors and/or other semiconductor features. The die 10 may be an integrated circuit (IC) chip. In some embodiments, a die separation process may be performed on the wafer, that is, a die singulation process may be performed to form the die 10. The die separation process may be performed by using a blade saw, a die break dicing process, a laser dicing process, or a combination thereof.

FIGS. 9A-9E are schematic cross-sectional views of a package structure at various stages of formation, according to some embodiments of the present disclosure. Here, an embodiment in which the flip chip type assembly is performed for the package structure shown in FIG. 4 is described.

Figure 9A:
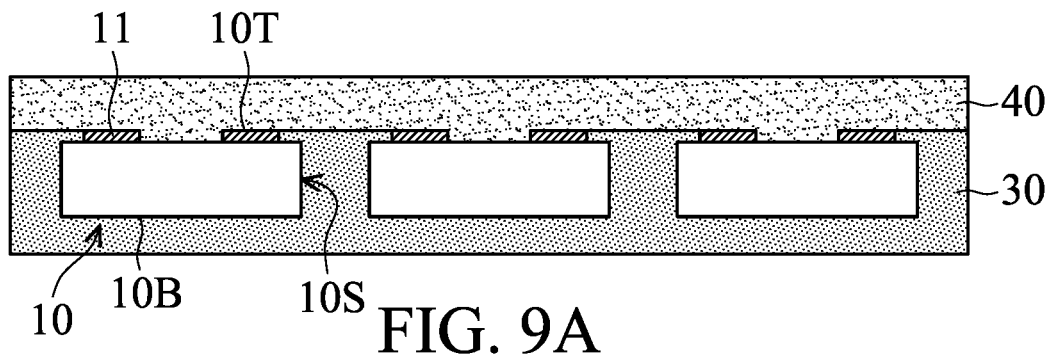
FIGS. 9A-9E are schematic cross-sectional views of a package structure at various stages of formation, according to some embodiments of the present disclosure.

Referring to FIG. 9A, a molding layer 40 is formed on the top surface 10T of the die 10, and the molding layer 40 is in contact with the protective layer 30. The forming method and material of the molding layer 40 may be the same as or different from the forming method and material of the protective layer 30. In some embodiments, the molding layer 40 is formed between the pads 11 on the upper layers of the source structure and the drain structure of the same die 10. In some embodiments, since the material of the molding layer 40 is the same as the material of the protective layer 30, the die 10 may be regarded as being encapsulated in the protective layer 30 and the molding layer 40. In some embodiments, the molding layer 40 covers the top surface 10T of the die 10, and may be in contact with the top surface of the second dielectric layer (for example, the second dielectric layer 160 shown in FIG. 8) of the die 10.

Figure 9B:
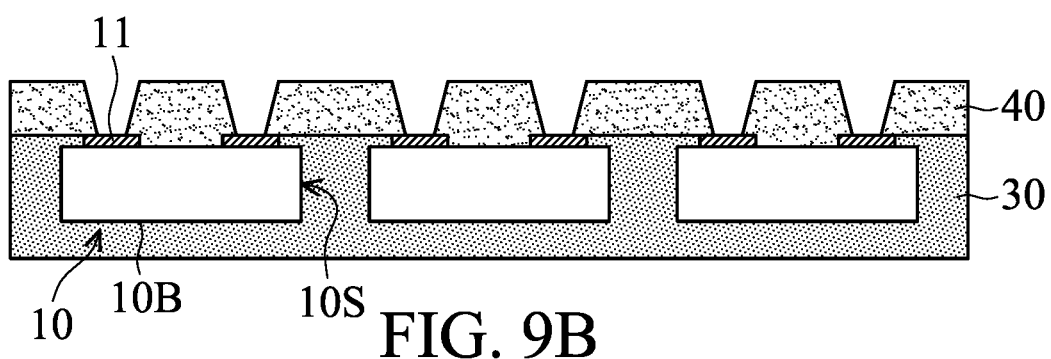

Referring to FIG. 9B, the molding layer 40 is patterned to form a plurality of openings so as to expose the top surface of the die 10. Specifically, the top surface of the pad 11 on the source metal layer of the die 10 and the top surface of the pad 11 on the drain metal layer are exposed to facilitate subsequent electrical connection. In some embodiments, the patterning process may be performed by using a laser patterning process, an etching process, or other suitable processes.

Figure 9C:
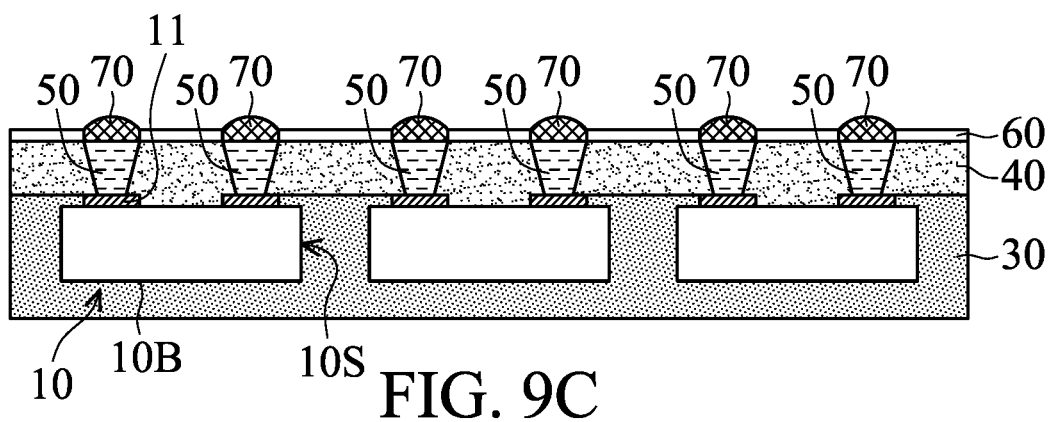

Referring to FIG. 9C, a redistribution structure may be formed on the molding layer 40 and in the aforementioned openings to change the location of the contact such as the pad 10 on the top surface of the source metal layer and the drain metal layer. Thus, the compatibility of die 10 applied to different package substrates may be improved.

As shown in FIG. 9C, in some embodiments, the first conductive component 50 may be formed in the molding layer 40. The first conductive component 50 may pass through the molding layer 40 to contact the pad 11, and be electrically connected to the source structure and the drain structure of the die 10. The first conductive component 50 may be or include a metal such as copper (Cu), aluminum (Al), gold (Au), tungsten (W), other conductive materials, or a combination thereof. In some embodiments, the first conductive component 50 may be a copper redistribution layer (Cu RDL) or an aluminum redistribution layer (Al RDL).

In some embodiments, a patterned capping layer 60 may be further formed on the molding layer 40. The pattern of the capping layer 60 may be designed according to requirements in order to achieve the effect of redistribution and/or rewiring. The capping layer 60 may include polybenzoxazole (PBO), polyimide (PI), benzocyclobutene (BCB) or the like. The capping layer 60 may be formed by a deposition process such as spin coating, chemical vapor deposition (CVD), lamination, or a combination thereof. In some embodiments, the capping layer 60 may be omitted.

In some embodiments, the second conductive component 70 may be formed on the first conductive component 50. The material of the second conductive component 70 and the material of the first conductive component 50 may be the same or different. In some embodiments, the second conductive component 70 may be spherical, columnar or any other shape. In some embodiments, the second conductive component 70 may be a copper pillar, a copper layer, nickel, a solder ball, a solder printing, a Ni/Au layer, a NiPdAu layer, or a combination thereof.

Figure 9D:
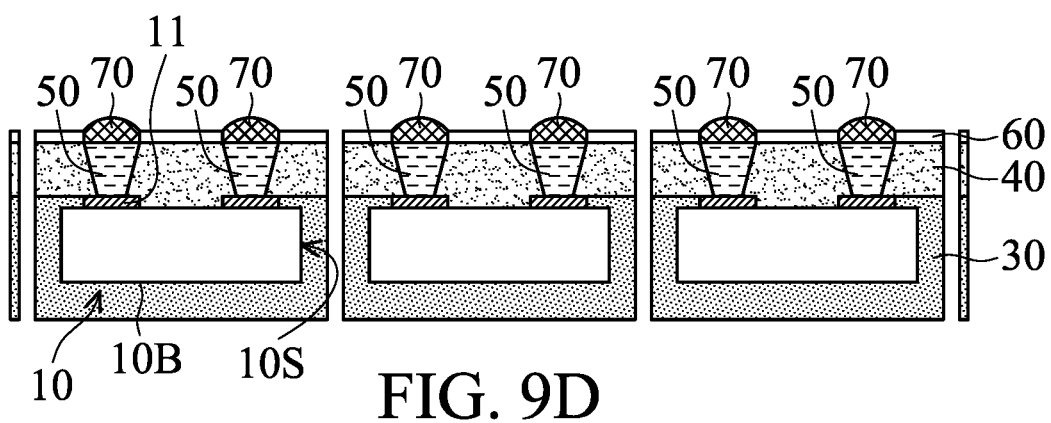

Referring to FIG. 9D, the cutting process 31 shown in FIG. 5 may be performed to separate one or more dies 10 into a unit.

Figure 9E:
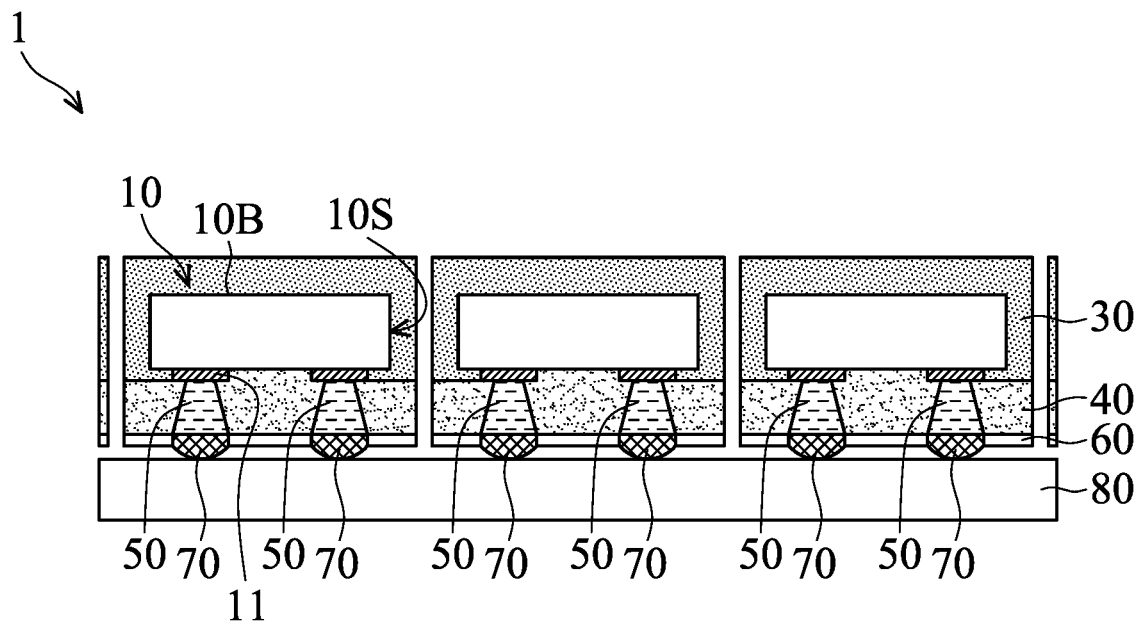

Referring to FIG. 9E, the separated unit including the die 10 is turned upside down and bonded to the package substrate 80. Specifically, the source structure and the drain structure in the die 10 electrically connect to the package substrate 80 by the first conductive component 50 and the second conductive component 70, so as to obtain the package structure 1 of the present disclosure. In some embodiments, the package substrate may include a silicon wafer, a metal substrate, or a printed circuit board (PCB). In some embodiments, the package substrate 80 may include a plurality of electronic components, such as resistors, capacitors, signal distribution circuits, or a combination thereof. The aforementioned electronic components may be active electronic components, passive electronic components or a combination thereof. In other embodiments, there are no active component or passive electronic component in the package substrate 80.

In some embodiments, the manufacturing method of the present disclosure may also be applied to ball grid array (BGA) package, quad flat non-leaded (QFN) package, quad flat (QFP) package, small outline integrated circuit (SOIC) package, dual flat no-lead (DFN) package or transistor outline (TO) package.

It should be noted that, since the present disclosure is provided with a protective layer 30 on the side surface 10S of the die 10, and the protective layer 30 extends to the side surface of the pad 11 of the die 10, the second conductive components 70 on the die 10 may be directly bonded to the packaging substrate 80. Thus, the traditional laminate plate may be omitted. Therefore, without using a traditional laminate plate, the thickness of the package structure 1 as shown in the present disclosure may be reduced. The package structure 1 in the present disclosure may improve the heat dissipation performance and the electrical connection performance.

Figure 10:
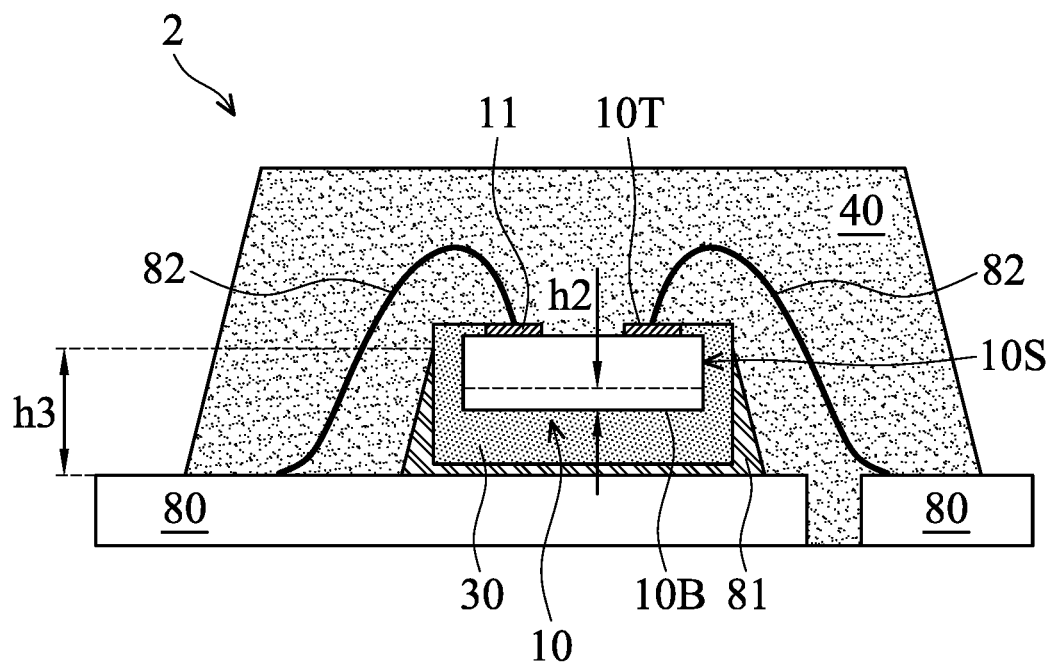
FIG. 10 is a schematic cross-sectional view of a package structure, according to other embodiments of the present disclosure.

FIG. 10 is a schematic cross-sectional view of a package structure, according to other embodiments of the present disclosure. Here, an embodiment in which the wire bond assembly is performed for the package structure shown in FIG. 4 is described.

Referring to FIG. 10, a package substrate 80 is provided, and a bonding layer 81 is formed on the package substrate 80. In some embodiments, the package substrate 80 may be a PCB substrate, and the aforementioned PCB substrate may include a plurality of chips with a lead frame. In some embodiments, the lead frame may be a packaging metal frame used for packaging the die 10. For example, the lead frame may include copper (Cu), iron nickel (NiFe), lead (Pb), tin (Sn), gold (Au), nickel (Ni), platinum (Pt), palladium (Pd), iridium (Ir), titanium (Ti), chromium (Cr), tungsten (W), aluminum (Al), stainless steel, other suitable materials or combinations thereof.

In some embodiments, the bonding layer 81 may include a polymer matrix and conductive particles dispersed in the polymer matrix. In some embodiments, the polymer matrix may include an acrylic resin such as polymethylmetacrylate (PMMA), epoxy resin, silicone, maleic anhydride, other suitable matrix materials, or a combination thereof. In some embodiments, the material of the conductive particles may include silver (Ag), copper (Cu), gold (Au), aluminum (Al), nickel (Ni), carbon (C), other suitable conductive materials, or a combination thereof. In some embodiments, the bonding layer 81 may be a non-conductive epoxy resin. For example, in some embodiments, the bonding layer 81 may be formed by a coating process, a printing process, or other suitable methods. In some embodiments, the bonding layer 81 may be silver glue.

Next, the die 10 covered with the protective layer 30 is connected to the package substrate 80 by the bonding layer 81. The bottom surface 10B of the die 10 is disposed on the top surface of the package substrate 80, and the top surface 10T of the die 10 is exposed. That is, the pads 11 on the upper layers of the source structure and the drain structure of the die 10 are exposed. A portion of the bonding layer 81 is between the protective layer 30 and the package substrate 80, and another portion of the bonding layer 81 extends along the side surface of the protective layer 30. The fillet caused by the bonding layer 81 has a third height h3. However, as shown in FIG. 10, in the package structure 1 of the present disclosure, even if the third height h3 is higher than the second height h2, the side surface of the die 10 is protected by covering with the protective layer 30. Thus, the die 10 is electrically isolated from the bonding layer 81, and an unnecessary conduction path is not generated between the die 10 and the bonding layer 81, thereby improving the reliability of the package structure and the process window of the manufacturing method.

Following the above, a wire 82 is formed on the package substrate 80, and the source structure and the drain structure of the die 10 are connected to the package substrate 80 by the wire 82 and the pads 11. In some embodiments, the wire 82 may be a gold (Au) wire, a copper (Cu) wire, a palladium copper (PdCu) wire, a silver wire, the like, or a combination thereof. It should be understood that, the aforementioned embodiments do not limit that the pads 11 on the upper layers of the source structure and the drain structure of the die 10 and the package substrate 80 must be connected by wires. Furthermore, according to the disclosed embodiment, the configuration relationship of the aforementioned features is not limited to those shown in the drawing.

After that, a molding layer 40 is formed on the package substrate 80 to cover the package substrate 80, the die 10, the bonding layer 81 and the wire 82, so as to obtain the packaging structure 2 of the present disclosure. In some embodiments, the cutting process 31 shown in FIG. 5 may be further performed.

It should be noted that, in the wire bond assembly process, the bonding layer 81 such as epoxy resin is required to fix the die 10 on the package substrate 80 including the lead frame. However, when the applied bonding layer 81 is insufficient, the die 10 will be detached from the package substrate 80, which reduces the reliability of the package structure. However, when too much bonding layer 81 is applied, the overflowing material of bonding layer 81 will generate fillet extending along the side surface 10S of the die 10, thereby creating unnecessary conduction paths and causing short circuits. Therefore, the reliability of the package structure may be reduced. Accordingly, as shown in FIGS. 4 and 10, the length of the protective layer 30 extending from the bottom surface 10B of the die 10 to the top surface 10T of the die 10 is greater than the second height h2. Therefore, the protective layer 30 may effectively avoid the short circuit problem caused by the overflowing material of the bonding layer 81, thereby improving reliability.

In summary, according to some embodiments, one purposes of the present disclosure is to avoid the short circuit problem caused by bonding the die during the packaging process by providing a protective layer on the side surface and/or bottom surface of the die. Furthermore, the reliability of the package structure and the process window of the manufacturing method may be improved. Furthermore, the overall thickness of the package structure obtained by the manufacturing method of the present disclosure is relatively thin, so the package structure of the present disclosure has excellent heat dissipation. The package structure of the present disclosure also has excellent electrical properties because of its shorter loop.

In addition, the protective layer may improve the resistance of the package structure to environmental or human damage. Moreover, the package structure and manufacturing method of the present disclosure is compatible with wire bond assembly or flip chip type assembly, so the manufacturing method of the present disclosure may be implemented without increasing the cost of additional processes, and industry production may be performed.

The foregoing outlines features of several embodiments of the present disclosure, so that a person of ordinary skill in the art may better understand the aspects of the present disclosure. A person of ordinary skill in the art should appreciate that, the present disclosure may be readily used as a basis for designing and/or modifying other processes and structures for carrying out the same purposes and/or achieving the same advantages of the embodiments introduced herein. A person of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a package structure, comprising:
   providing a carrier board;
   providing at least one die on the carrier board, wherein the at least one die has a top surface, a bottom surface, and a side surface and the at least one die comprises:
      a substrate comprising a base, a buried layer disposed on the base, and a seed layer disposed on the buried layer;
      a semiconductor layer disposed on the substrate;
      a gate structure disposed on the semiconductor layer;
      a source structure and a drain structure disposed on opposite sides of the gate structure;
      at least one dielectric layer covering the gate structure, the source structure, and the drain structure; and
      at least one pad disposed on the at least one dielectric layer and penetrating through the at least one dielectric layer to electrically contact with the gate structure, the source structure or the drain structure; and
   forming a protective layer to cover at least a portion of the side surface of the at least one die,
   wherein the seed layer is located between the buried layer and the semiconductor layer, and the protective layer covers a side surface of the seed layer and exposes the buried layer and the base.

2. The method as claimed in claim 1, further comprising:
   performing a bonding step before the formation of the protective layer, wherein the at least one die is provided in plurality, the pads of the dies are bonded on the carrier board, and the protective layer covers a gap between two adjacent dies.

3. The method as claimed in claim 2, further comprising:
   forming an adhesive layer on the carrier board before the formation of the protective layer; and
   removing the adhesive layer and the carrier board after the formation of the protective layer.

4. The method as claimed in claim 3, further comprising:
   performing a cutting step, wherein a cutting path is located in the gap and the dies are separated by cutting the protective layer.

5. The method as claimed in claim 2, further comprising:
   forming a molding layer on the top surface of the at least one die, wherein the molding layer is in contact with the protective layer;
   patterning the molding layer to form a plurality of openings so as to expose the pads;
   forming a conductive component in the plurality of openings, wherein the conductive component is in contact with the pads; and
   providing a packing substrate, wherein the conductive component is bonded on the packing substrate.

6. The method as claimed in claim 1, further comprising:
   performing a bonding step before the formation of the protective layer, wherein the at least one die is provided in plurality, the bottom surfaces of the dies are bonded on the carrier board, and the protective layer covers a gap between two adjacent dies.

7. The method as claimed in claim 6, further comprising:
   forming an adhesive layer on the carrier board before the formation of the protective layer; and
   removing the adhesive layer and the carrier board after the formation of the protective layer.

8. The method as claimed in claim 7, further comprising:
performing a cutting step, wherein a cutting path is located in the gap and the dies are separated by cutting the protective layer.

9. The method as claimed in claim 6, further comprising:
providing a packing substrate;
forming a bonding layer on the packing substrate;
disposing the bottom surface of the covered dies on the bonding layer, wherein the pads are exposed;
forming a wire on the packing substrate, wherein the wire connects the pads and the packing substrate; and
forming a molding layer on the packing substrate to cover the packing substrate, the dies, the bonding layer and the wire.

10. The method as claimed in claim 1, wherein the protective layer covers at least a portion of the top surface of the at least one die, the protective layer completely covers the side surface of the at least one die, or the protective layer covers the bottom surface away from the at least one pad.

11. A package structure, comprising:
at least one die having a top surface, a bottom surface, and a side surface, wherein the at least one die comprises:
a substrate comprising a base, a buried layer disposed on the base, and a seed layer disposed on the buried layer;
a semiconductor layer disposed on the substrate;
a gate structure disposed on the semiconductor layer;
a source structure and a drain structure disposed on opposite sides of the gate structure;
at least one dielectric layer covering the gate structure, the source structure, and the drain structure; and
at least one pad disposed on the at least one dielectric layer and penetrating through the at least one dielectric layer to electrically contact with the gate structure, the source structure or the drain structure; and
a protective layer covering at least a portion of the side surface of the at least one die,
wherein the seed layer is located between the buried layer and the semiconductor layer, and the protective layer covers a side surface of the seed layer and exposes the buried layer and the base.

12. The package structure as claimed in claim 11, wherein the protective layer covers at least a portion of the top surface of the at least one die.

13. The package structure as claimed in claim 11, wherein the protective layer completely covers the side surface of the at least one die.

14. The package structure as claimed in claim 11, wherein the protective layer covers the bottom surface of the at least one die, and the bottom surface is away from the at least one pad.

15. The package structure as claimed in claim 1, wherein the base comprises a ceramic base or a silicon base.

16. The package structure as claimed in claim 15, wherein a material of the ceramic base comprises aluminum nitride (AlN), silicon carbide (SiC), aluminum oxide ($Al_2O_3$), or a combination thereof.

17. The package structure as claimed in claim 15, wherein a material of the seed layer comprises silicon (Si), silicon carbide, aluminum nitride, or a combination thereof.

18. The package structure as claimed in claim 11, further comprising:
a molding layer disposed on the top surface of the at least one die, wherein the molding layer is in contact with the protective layer;
a conductive component passing through the molding layer to contacts with the at least one pad; and
a packing substrate bonding to the conductive component.

19. The package structure as claimed in claim 11, further comprising:
a packing substrate;
a bonding layer formed on the packing substrate, wherein the at least one die is bonded with the packing substrate through the bonding layer;
a wire formed on the packing substrate, wherein the wire connects the at least one pad and the packing substrate; and
a molding layer formed on the packing substrate and covering the packing substrate, the at least one die, the bonding layer and the wire.

20. The package structure as claimed in claim 19, wherein the bonding layer comprises a non-conductive or conductive epoxy resin.

* * * * *